(12) United States Patent
Schreiber

(10) Patent No.: US 8,189,301 B2
(45) Date of Patent: May 29, 2012

(54) WIRELESS MICROACTUATOR MOTOR ASSEMBLY FOR USE IN A HARD DISK DRIVE SUSPENSION, AND MECHANICAL AND ELECTRICAL CONNECTIONS THERETO

(75) Inventor: Christopher Schreiber, Temecula, CA (US)

(73) Assignee: Magnecomp Corporation, Murrieta, CA (US)

( * ) Notice: Subject to any disclaimer, the term of this patent is extended or adjusted under 35 U.S.C. 154(b) by 329 days.

(21) Appl. No.: 12/429,848

(22) Filed: Apr. 24, 2009

(65) Prior Publication Data
US 2010/0271735 A1     Oct. 28, 2010

(51) Int. Cl.
*G11B 21/21*     (2006.01)
*G11B 5/56*      (2006.01)
(52) U.S. Cl. .................................. 360/294.4
(58) Field of Classification Search ............... 360/294.4; 310/311, 314, 365, 366, 367
See application file for complete search history.

(56) References Cited

U.S. PATENT DOCUMENTS

| | | | |
|---|---|---|---|
| 5,632,841 A | 5/1997 | Hellbaum et al. | |
| 5,639,850 A | 6/1997 | Bryant | |
| 6,060,811 A | 5/2000 | Fox et al. | |
| 6,172,446 B1 * | 1/2001 | Kanayama et al. | 310/348 |
| 6,278,587 B1 | 8/2001 | Mei | |
| 6,728,077 B1 * | 4/2004 | Murphy | 360/294.4 |
| 6,734,603 B2 | 5/2004 | Hellbaum et al. | |
| 6,856,075 B1 | 2/2005 | Houk et al. | |
| 7,218,481 B1 * | 5/2007 | Bennin et al. | 360/294.4 |
| 7,417,830 B1 * | 8/2008 | Kulangara | 360/294.4 |
| 7,440,236 B1 * | 10/2008 | Bennin et al. | 360/294.4 |
| 7,459,835 B1 | 12/2008 | Mei et al. | |
| 7,595,581 B2 * | 9/2009 | Aoki et al. | 310/328 |
| 7,595,965 B1 * | 9/2009 | Kulangara et al. | 360/294.6 |
| 2003/0137223 A1 * | 7/2003 | Kitajima et al. | 310/364 |
| 2003/0142448 A1 * | 7/2003 | Koganezawa | 360/294.4 |
| 2008/0180849 A1 * | 7/2008 | Umemiya et al. | 360/240 |
| 2009/0086379 A1 * | 4/2009 | Hanya et al. | 360/294.4 |

FOREIGN PATENT DOCUMENTS
JP           3142754 U   *   6/2008

OTHER PUBLICATIONS

In re Garnero, 412 F.2d 276, 279, 162 USPQ 221, 223 (CCPA 1969).*
Saxe and Levitt, "Product by Process Claims and Their Current Status in Chemical Patent Office Practice," 42 JPOS 528, 536, 537 (Aug. 1960), pp. 528, 536, 537.*
English-machine translation of Nishihara (JP 3142754 U), published on Jun. 26, 2008.*
Face International Corporation, "Thunder White Paper," Feb. 21, 2001.

* cited by examiner

*Primary Examiner* — Will J Klimowicz
(74) *Attorney, Agent, or Firm* — Intellectual Property Law Offices of Joel Voelzke, APC

(57) ABSTRACT

A microactuator assembly for a hard disk drive head suspension has an expandable base of stainless steel sheet material defining a negative lead affixed to the negative electrode on the bottom surface of a piezoelectric element, and a piece of stainless steel sheet material defining a positive lead attached to the positive electrode on the top surface of the piezoelectric element. The leads may be affixed directly to the piezoelectric element via conductive adhesive. The microactuator assembly can be assembled separately, and then laser welded into place on a suspension. A bond pad made of stainless steel sheet material extends from the flexible circuit, is electrically connected to the microactuator driving voltage conductor within the flexible circuit through a via, and is electrically isolated from the suspension substrate by an insulating film. The microactuator unit positive lead is mechanically and electrically connected to the bond pad via laser welding.

18 Claims, 8 Drawing Sheets

WIRELESS MICROACTUATOR MOTOR ASSEMBLY FOR USE IN A HARD DISK DRIVE SUSPENSION, AND MECHANICAL AND ELECTRICAL CONNECTIONS THERETO

CROSS-REFERENCE TO RELATED APPLICATIONS

None.

BACKGROUND OF THE INVENTION

1. Field of the Invention

This invention relates to the field of microactuated hard disk drive suspensions. More particularly, this invention relates to the field of a wireless microactuator assembly for a hard disk drive suspension, and mechanical and electrical connections to the microactuator.

2. Description of Related Art

Storage of information has progressed through the years. From the early days, primitive man stored information on walls of caves, as well as used writings on wood such as bamboo. Since then, people have used wood, silk, and papers as a media for writings. Paper has been bound to form books. Information is now stored electronically on disks, tape, and semiconductor devices. As merely an example, some of the early disks used magnetic technology to store bits of information in a digital manner onto the magnetic media. One of the first disk drives was discovered in the 1950's by International Business Machines of Armonk, N.Y.]

Although such disks have been successful, there continues to be a demand for larger storage capacity drives. Higher storage capacity can be achieved in part by increasing an aerial density of the disk. That is, the density increases with the number of tracks per inch (TPI) and the number of bits per inch (BPI) on the disk.

As track density increases, however, the data track becomes narrower and the spacing between data tracks on the disk decreases. It becomes increasingly difficult for the motor and servo control system to quickly and accurately position the read/write head over the desired track. Conventional actuator motors, such as voice coil motors (VCM), often lack sufficient resolution and bandwidth to effectively accommodate high track-density disks. As a result, a high bandwidth and resolution second-stage microactuator is often necessary to precisely position the read/write head over a selected track of the disk for reading data from the disk and writing data to the disk. A suspension having such a second-stage microactuator is often referred to as a microactuated suspension or a dual stage actuator (DSA) suspension.

Microactuators for suspensions such as hard disk drive suspensions are typically piezoelectric devices, and more specifically, lead zirconate titanate (PZT). For simplicity of the following discussion, the term "PZT" will be used to refer in general to a piezoelectric device. U.S. Pat. No. 7,459,835 issued to Mei et al. shows a disk drive suspension having two PZT microactuators for the fine positioning of a read/write head over the desired track of a hard disk. U.S. Pat. No. 6,278,587 issued to Mei at all describes a microactuated suspension in which the microactuator is held to the load beam by interfitting structures. A common method of bonding PZTs to suspensions and electrically connecting to the PZTs is to apply a conductive epoxy on one surface of the PZT, thus providing both a mechanical and electrical bond between one polarity of the PZT and the stainless steel substrate of the suspension, and either a thermosonic or solder connection to the opposing surface of the PZT. U.S. Pat. No. 6,456,464 issued to Khan et al. describes a microactuated suspension in which the microactuator is mechanically and electrically bonded using a conductive adhesive such as a silver filled epoxy resin. U.S. Pat. No. 6,734,603 issued to Hellbaum et al. describes an interconnection technique that uses a high temperature polyimide adhesive. Typically, a first end of a wire lead referred to as a "tail weave" must be bonded to at least one of the PZT faces, such as by soldering, by conductive adhesive, or by thermosonic bonding, and the other end of the wire must be connected to the flexible circuit, sometimes called the "flex trace" or "flexure."

FIG. 10 is a side perspective view of a prior art microactuated suspension. Two PZT elements 1002 and 1004 are affixed atop the suspension, with control voltages applied to the two PZTs through lead wires 1006. The result is that the magnetic read/write head mounted at the end of the load suspension moves back and forth in response to command voltages applied by the controller to the PZTs, so that the read/write head follows the desired data track on the disk. In the particular suspension shown, the two PZTs 1002 and 1004 have opposite polarity and therefore can be driven by a single voltage applied via a single wire 1006. Control wire 1006 is also bonded to bond pad 1010 of the flexible circuit to bring the control voltage to the PZTs. In other designs, the PZTs have the same polarity, and two separate control wires must be soldered or otherwise bonded to PZTs 1002 and 1004 on one end and to a bond pad 1010 on the other end. The control wires are sometimes referred to as a "tail weave." The tail weave process is typically delicate and time consuming, thus adding a significant cost component to the finished suspension assembly.

A technique referred to as Thin Layer Unimorph Ferroelectric Driver and Sensor ("Thunder") and described in U.S. Pat. Nos. 5,639,850, 6,060,811, and 5,632,841, involves laminating stainless steel, PZT, and aluminum using a high temperature adhesive, in order to pre-stress the structure upon cooling thereby giving the device a greater stroke distance.

One disadvantage to using a high temperature epoxy or other high temperature process to make mechanical and/or electrical connections to the PZT material is that upon cooling the PZT is under compression and is actually bowed due to the mismatches in coefficients of thermal expansion (CTE) between the stainless steel and the PZT. Although a pre-bowed PZT is claimed by the marketers of the Thunder process to provide increased stroke length, the temperature encountered in high temperature lamination results in a de-poling of the PZT. This de-poling reduces the effective stroke length of the device, or requires repoling as discussed in U.S. Pat. No. 6,734,603. However, because the PZT is physically constrained by its adhesion to the suspension during the re-poling process, in this constrained state the PZT will typically attain less than 80% of its original D31 displacement (Δ length).

A further disadvantage to using adhesive to bond the PZT to the stainless steel is that the adhesive bonding process generally not compatible with the clean room requirements for assembling disk drives. This is especially true when using conductive adhesives, which generally contain small metallic particles. The adhesive bonding process can produce small stray particles that can lead to product defects.

SUMMARY OF THE INVENTION

The present invention provides a mechanical bond and electrical interconnection for a PZT microactuator that does not require high temperatures and therefore does not suffer from depoling. The invention provides a method of making an actuator that is useful in a suspension assembly and that does not suffer from some of the drawbacks of the prior art. Specifically, a microactuator assembly containing a PZT bonded to stainless steel is prepared separately. The assembly can be prepared in a relatively dirty environment and at a relatively low temperature and then cleaned. The assembly can then be readily integrated into a suspension and mechanically and electrically connected to the suspension, such as to the stainless steel substrate from which the load beam is formed, using laser welding. In one embodiment, segmenting the base stainless steel allows a higher percentage of the original D31 to be attained in the repoling process. Silver containing conductive adhesives possessing sufficient resiliency and conductivity can be cured below the Curie temperature that would result in degradation of the D31 that would mandate re-polling of the PZT In a case where re-polling would be required, the segmented structures taught herein do not restrain the PZT as would a continuous sheet such as in Thunder or a standard PZT integrated into a suspension assembly using conventional methods. Additional advantages are that the assembly is relatively flat, and can be constructed separately and then later integrated into the suspension using standard laser welding processes that are clean and do not produce potentially contaminating particles.

In one aspect therefore, and in one exemplary embodiment, the invention is of a microactuator unit that is prepared separately and then integrated into a suspension using welding such as laser welding. The microactuator unit includes a PZT element having a lead defining a positive lead attached to the positive electrode on the top surface of the piezoelectric element. The positive lead is made from sheet stainless steel material and thus is generally flat and planar. The microactuator unit also has at least one base attached to the negative electrode on the bottom surface of the PZT element. The base can be two separate bases attached at opposite ends of the bottom of the PZT, or it can be a single, unitary component that is formed from a single continuous piece of material with an expandable connecting portion or bridge between the opposite ends of the unitary base. The middle portion can be made expandable, for example, by fan folds or by a serpentine pattern of voids. Whether the bases comprises separate pieces or are part of a single unitary piece of material, the two bases are stainless steel, and define negative leads. All three leads extend beyond the periphery of the PZT element. The assembly thus defines a microactuator unit that has a PZT element and weldable positive and negative leads extending therefrom beyond the periphery of the PZT element to facilitate mechanical and electrical integration into a suspension.

The top and bottom leads may be attached to the top and bottom PZT surfaces, respectively, by conductive adhesive, or by an non-conductive material such as polyimide having a via formed therethrough with the via being filled with a conductive material such as silver solder or conductive epoxy, or by other suitable methods that provide both a secure mechanical and electrical connections.

The suspension includes a stainless steel substrate, which by itself is standard. The microactuator unit may be fabricated separately, possibly in a relatively dirty environment compared to the clean environment required for final assembly of a head suspension, and thereafter cleaned and transported to the suspension assembly environment. The microactuator unit can then be mechanically affixed to the suspension by welding such as laser welding the two stainless steel bases to the stainless steel substrate of the suspension, thus providing both a mechanical connection and a direct ground connection from the PZT element's negative electrode to the suspension substrate without any wires therebetween.

A bond pad that carries the PZT actuation voltage is disposed partially underneath the suspensions' flexible circuit, and extends outward from the flexible circuit. The bond pad is made from stainless steel sheet material, and has an insulating layer such as an insulating film underneath it in order to electrically isolate it from the suspension substrate. The bond pad is electrically connected to the conductor within the flexible circuit that carries the PZT actuation voltage through a via that extends from that conductor through the polyimide or other insulator that forms the insulator in the flexible circuit, to the stainless steel sheet material underneath. The via is filled with an electrically conductive material such as electrically conductive epoxy or silver solder, thus establishing the electrical connection from the flexible circuit to the stainless steel bond pad extending from the flexible circuit along the top surface of the suspension substrate. The top lead extending from the PZT is laser welded to the bond pad, thus completing the electrical connection from the flexible circuit to the PZT positive electrode without any wires therebetween. Thus the invention is of a microactuator assembly that can be welded into place in a suspension and thus be both mechanically and electrically integrated into the suspension without any wires connected to the PZT element or the microactuator assembly, thus eliminating the conventional, exacting, and time consuming tail weave process. The invention also eliminates the use of adhesives and solder in the final suspension assembly process, at least in relation to the microactuator.

The suspension substrate can have a recessed area for receiving the microactuator unit, with the bases that define the negative leads being welded directly to the recessed surface. The positive lead extends to and is welded to the bond pad which is located on an unrecessed portion of the suspension substrate.

In the usual construction such as shown in FIG. 10, a microactuated suspension includes two PZT's disposed side by side in parallel and activated in push-pull fashion, i.e., the left side PZT is activated with a voltage of one polarity thus contracting it, and the right side PZT is simultaneously activated with a voltage of the opposite polarity thus expanding it, and vice versa. The present invention may be used in that conventional push-pull arrangement. Alternatively, the present invention may be used in arrangements in which only a single PZT unit is used for microactuation.

A microactuated suspension made according to the invention is then incorporated into an entire disk drive including the magnetic disk and disk drive motor that rotates the disk. In a multiple platter disk drive, one suspension is associated with each disk, and each suspension may be a microactuated suspension according to the present invention.

Exemplary embodiments of the invention will be further described below with reference to the drawings, in which like numbers refer to like parts.

DETAILED DESCRIPTION OF THE PREFERRED EMBODIMENTS

Although the term "PZT" strictly refers to a lead zirconate titanate device, in the description of the preferred embodiments that follow, for simplicity the term "PZT" will be used to refer broadly to any piezoelectric device.

Figure 10:
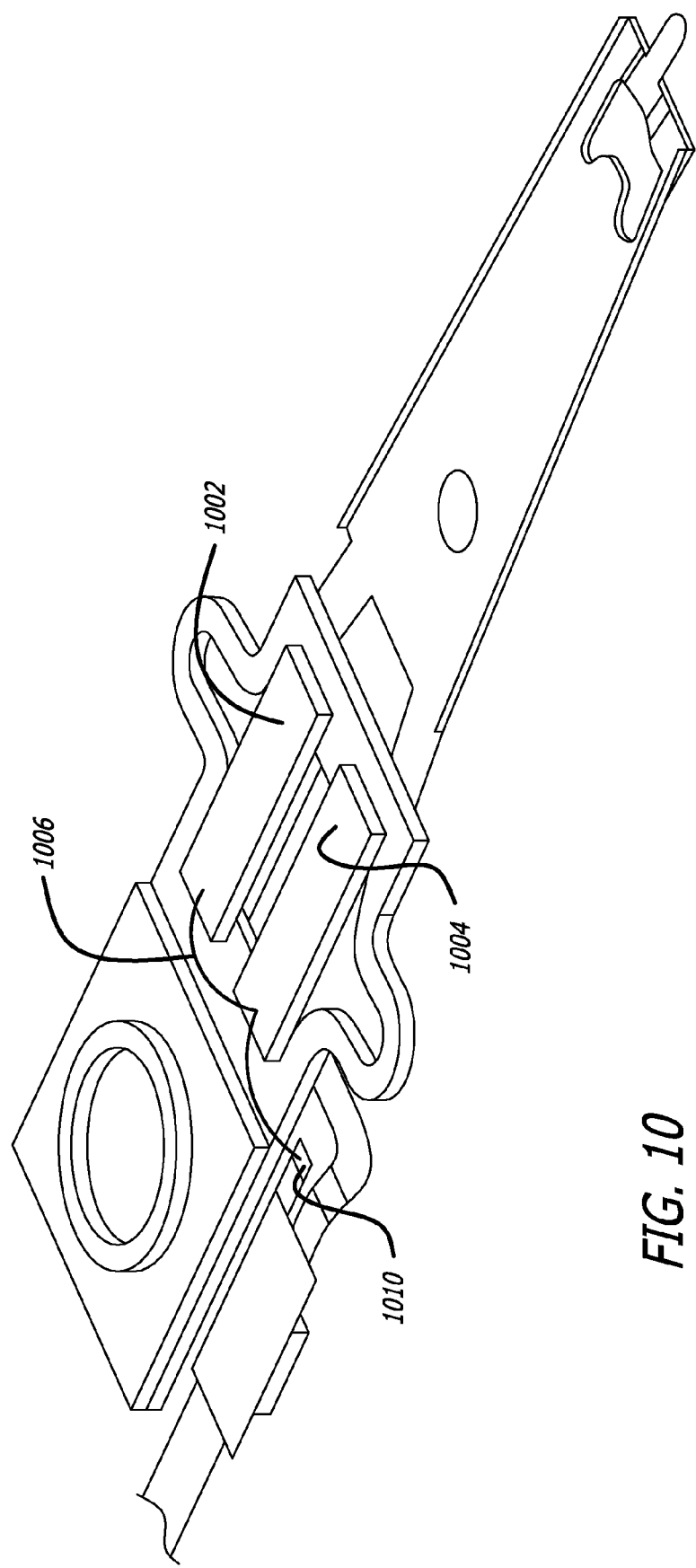
FIG. 10 is a prior art microactuated suspension.

FIG. 10 is a prior art microactuated suspension for a hard disk drive. Two PZT microactuators, 1002 and 1004, are arranged side by side to operate in push-pull fashion. Lead wires 1006 may be soldered or thermosonically bonded to the top of PZTs 1002 and 1004, and to bond pad 1010 from the flexible circuit such as shown, for example, in U.S. Pat. No. 7,440,236 issued to Bennin et al. using gold wires. As an alternative to wires, the flexible circuit can have a lead that is wrapped around to interconnect of the opposing surface of the PZT. Such a structure and the method of connecting it is termed a tail weave. Increasing the length of the lead wire 1006 is uncommon as it reduces the panelization of the circuit, which is an expensive component of the assembly. Other methods of connection are possible. The bottom sides of PZTs 1002 and 1004, where the negative electrodes are located, are typically adhered to the suspension substrate by conductive adhesive such as conductive epoxy. In this prior art microactuator, the PZTs must be adhered to the suspension using some type of adhesive. The use of adhesive and soldering within the suspension assembly environment is undesirable because minute amounts of adhesive or solder can contaminate the surface of the read/write head, which can cause disk drive failures. Additionally, creating the wire connection 1006 to bond pad 1010 or the alternative tail weave is time consuming and exacting work.

Figure 1A:
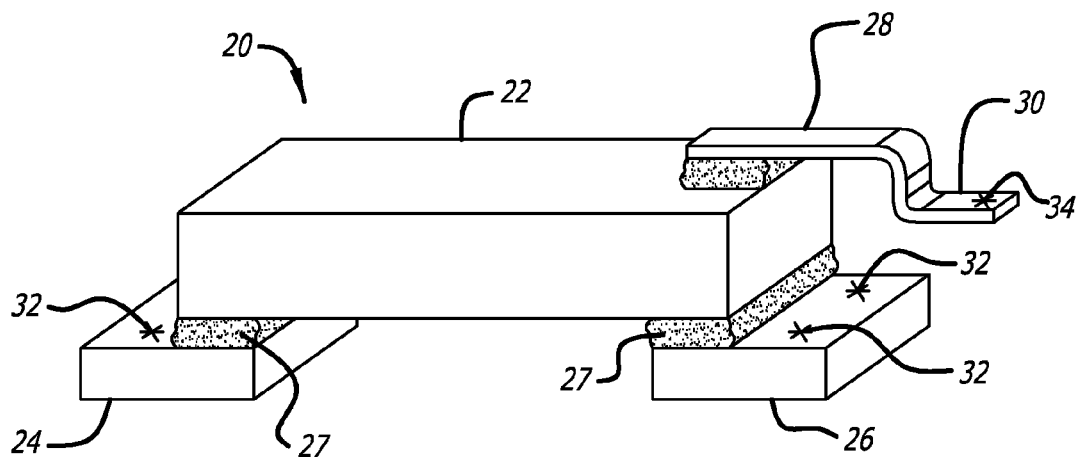
FIG. 1A is a side perspective view of a microactuator assembly according to a first embodiment of the invention.

FIG. 1A is a side perspective view of a microactuator assembly according to a first embodiment of the invention. First base 24 and second base 26 are affixed to the bottom surface of PZT element 22, the bottom surface being a negative electrode of PZT element 22. Bases 24 and 26 can be affixed to bottom of PZT element 22 using conductive adhesive 27 such as conductive epoxy, or by other methods as will be discussed later. Bases 24 and 26 are formed of a conductive material which is stainless steel that is preferably thin enough for laser welding, such as sheet stainless steel material. Bases 22 and 24 will be welded at weld locations 32. A top lead 28 made of a stainless steel sheet material, and having a generally flat and planar section, is attached to the top surface of PZT element 22 which is the positive electrode of PZT element 22. Top lead 28 has two bends formed in it, thereby forming a generally planar lead tab 30 which will be welded at weld location 34. In this embodiment bases 24 and 26 are separate components that are individually adhered to opposite ends of the bottom surface of PZT element 22. The three leads, namely first base 24, second base 26, and top lead 28, are each laser weldable which includes being sufficiently accessible from respective top and bottom surfaces thereof to allow bases 24 and 26, and top lead 28, to be welded to other parts, and each extends beyond the periphery of PZT element 22 in order to allow such access for welding. Thus, microactuator assembly 20 constitutes a PZT microactuator having weldable stainless steel leads extending outward beyond the periphery of PZT element 22, with each of the leads being ready for welding to another part of the suspension. The leads could be of a conductive material other than stainless steel, such as another conductive metal. Stainless steel is considered the preferred material, however, due to its weldability to the other stainless steel components comprising the suspension. The stainless steel surfaces to which conductive adhesive 27 will be applied may be cut, stamped, or etched to form groove patterns therein, in order to increase the adhesive bond strength as is known. The groove patterns may define parallel, cross-cross, radial, circular, curved, herringbone, and overlapped crossings at angles.

Figure 1B:
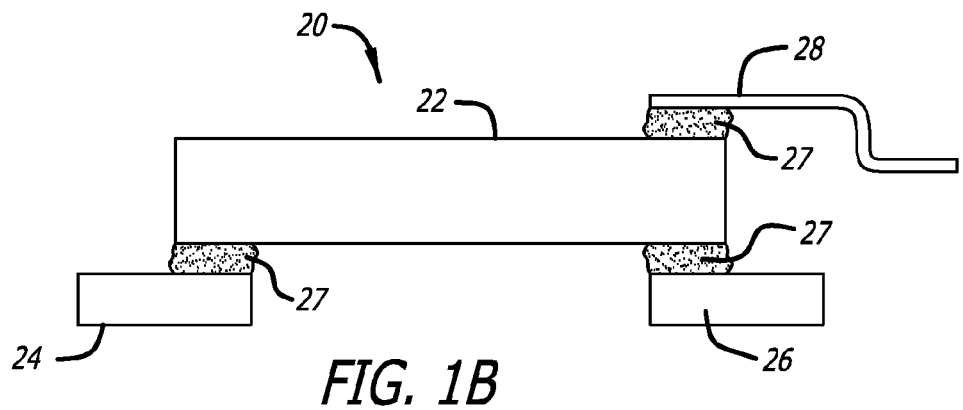
FIG. 1B is a side elevation view of the microactuator assembly of FIG. 1A.
Figure 1C:
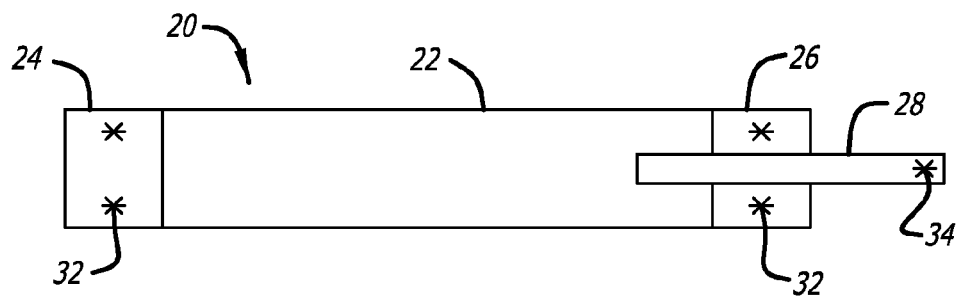
FIG. 1C is a top plan view of the microactuator assembly of FIG. 1A.

FIG. 1B and FIG. 1C are a side elevation view and a top plane view, respectively, of the microactuator assembly of FIG. 1A.

Figure 7:
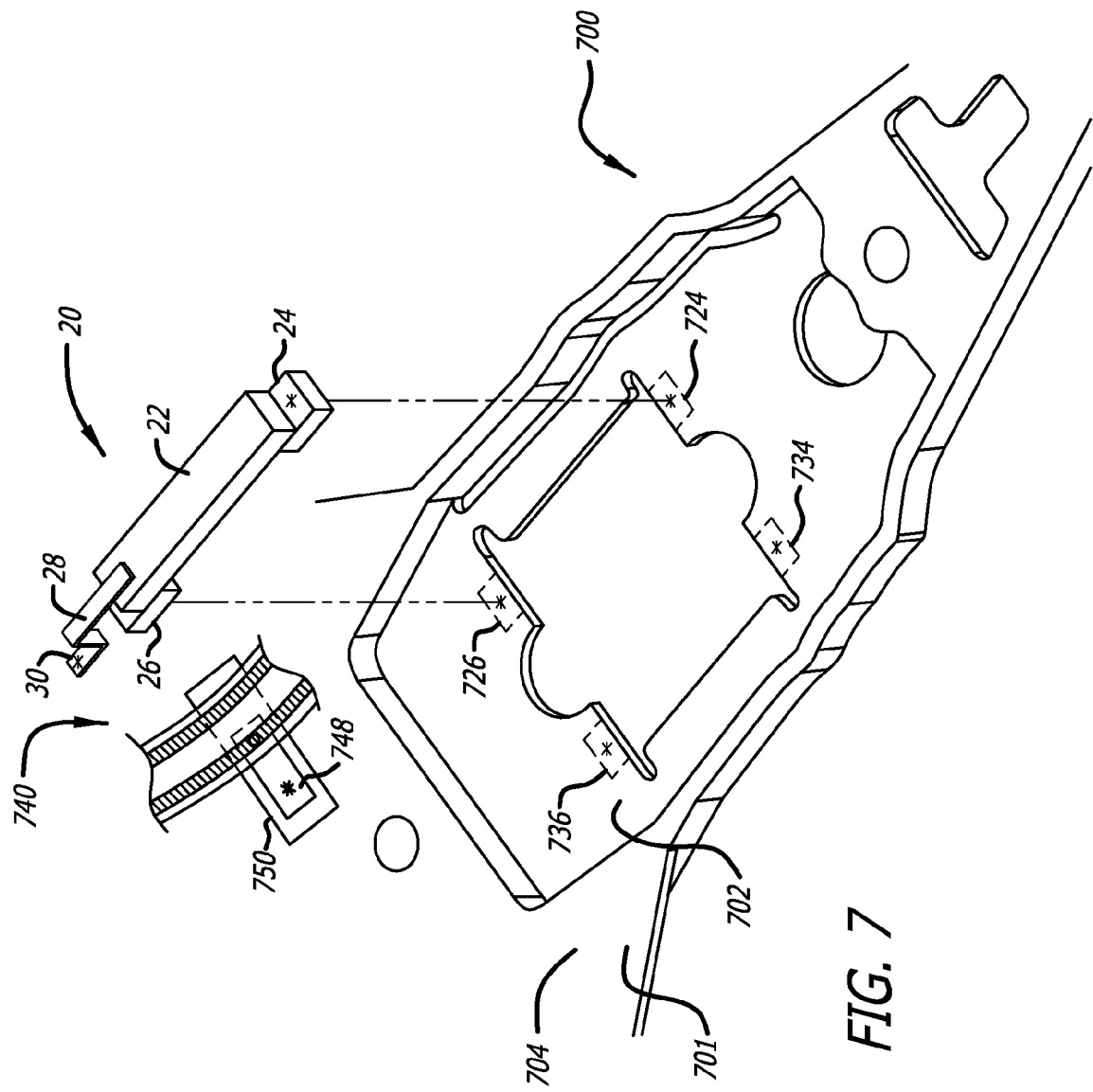
FIG. 7 is an exploded perspective view of a suspension including the microactuator assembly of FIG. 1A.

The microactuator unit 20 of FIGS. 1A-1C can be fabricated separately, then cleaned, then integrated into a head suspension such as the suspension 700 shown in FIG. 7. One advantage of the invention, therefore, is that microactuator assembly 20 can be fabricated separately in a relatively dirty manufacturing environment compared to the very clean environment required for disk drive assembly.

Figure 2A:
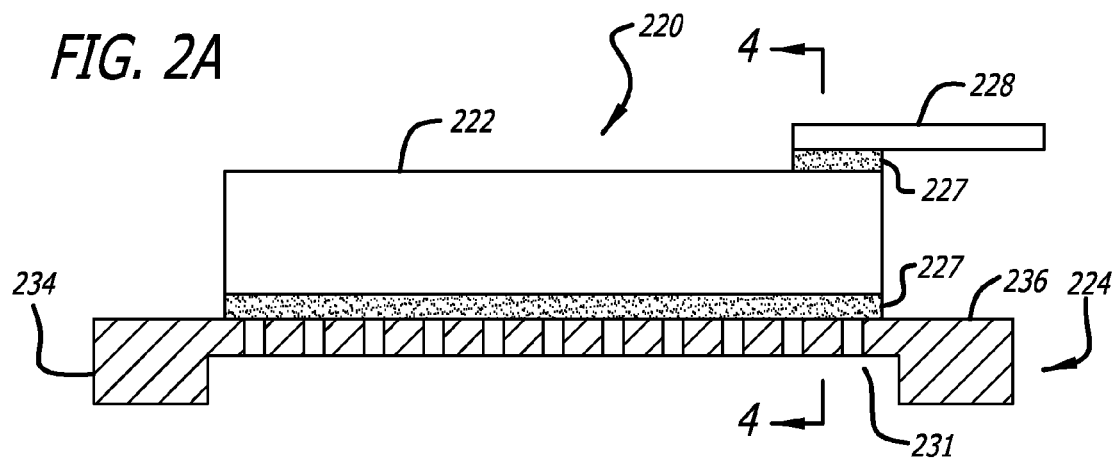
FIG. 2A is a side elevation view of a microactuator assembly according to a second embodiment of the invention.

FIG. 2A is a side elevation view of a microactuator assembly according to a second embodiment of the invention. In this embodiment, the two bases 234 and 236 located at opposite ends of PZT element 222 are fabricated out of a single unitary piece of material that defines a unitary base 224. A gap 231 is formed between bases 234 and 236 such as by chemical etching or laser etching. Unitary base 224 is affixed to the bottom surface which is the negative electrode of PZT element 222 by polyimide 227 which will be described in detail later with respect to FIG. 4. Similarly, top lead 228 is affixed to the top surface which is the positive electrode of PZT element 222 by polyimide 227.

Figure 2B:
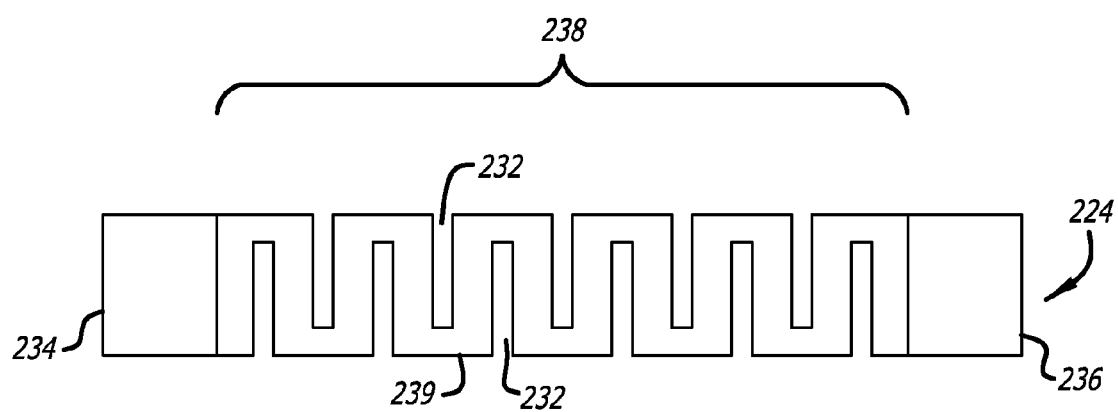
FIG. 2B is a bottom plan view of the unitary base 224 of the microactuator assembly FIG. 2A.

FIG. 2B is a bottom plan view of the unitary base 224 of the microactuator assembly FIG. 2A. An expandable bridging section or connecting section 238 connects first base 234 to second base 236, thus rendering the PZT negative lead expandable between the two loci at which it is attached to the PZT. Expandable bridging section has features formed therein that allow it to expand, such as a pattern of voids 232 formed therein by etching to create a serpentine pattern 239 in the material. Alternatively, unitary base 224 could be fabricated from separate bases and a bridging section made from any expandable component, with the three separate portions then affixed together. However, the unitary base 224 made from a single piece of stainless steel material is considered preferred for ease of fabrication and handling.

Figure 3:
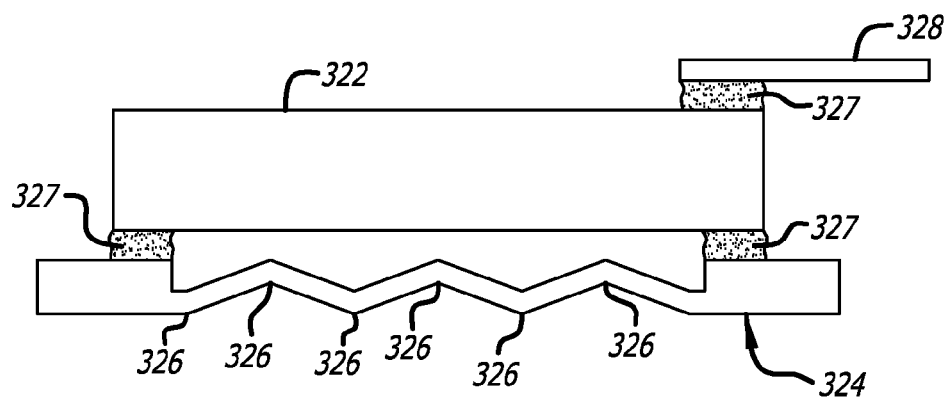
FIG. 3 is a side elevation view of a microactuator assembly according to a third embodiment of the invention.

FIG. 3 is a side elevation view of a microactuator assembly according to a third embodiment of the invention. In this embodiment, the feature in unitary base 324 that allows the base to expand is a series of accordion like folds 326. Alternatively, the expandable bridging section 238 could have corrugations in it that allow it to expand. Conductive adhesive 327 is used to affix the unitary base 324 and top lead 328 to PZT element 322.

Figure 4:
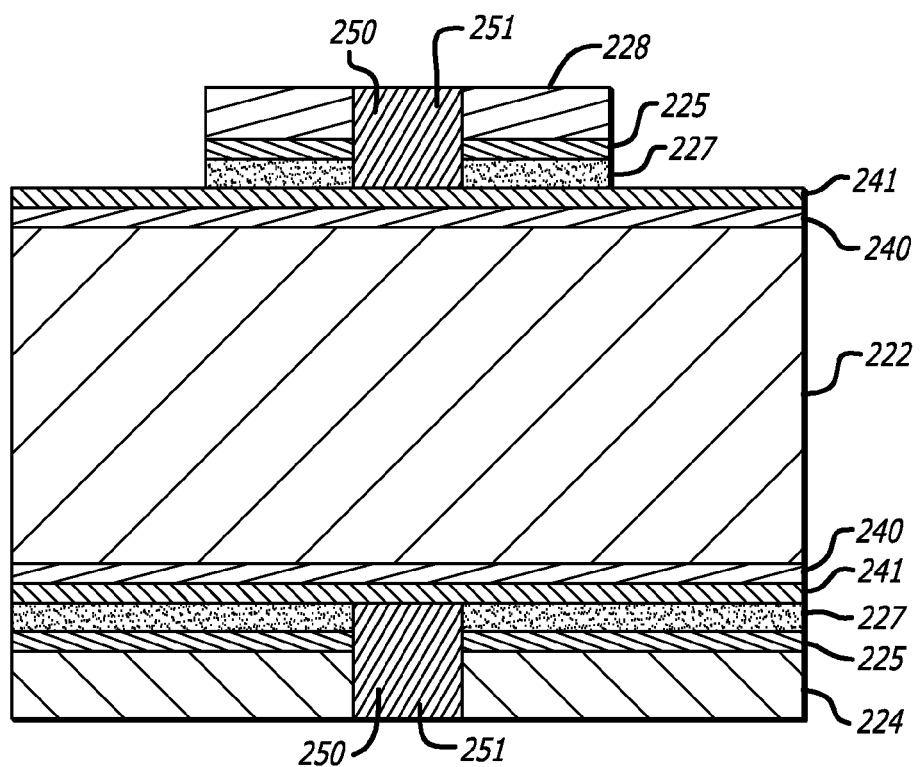
FIG. 4 is a side cutaway view of the microactuator assembly of FIG. 2A.

FIG. 4 is a side cutaway view of the microactuator assembly of FIG. 2A taken along section line 4-4, showing details of the various materials that may be used to mechanically and electrically attach leads 228 and 224 to PZT element 222. PZT element 222 is first coated on both surfaces with a sputtered metal layer 240 such as nickel (Ni) or chromium (Cr). Next, a highly conductive layer 241 such as sputtered gold (Ag) or titanium (Ti) is applied. This renders the surface of PZT element 222 highly conductive so that charge from the associated lead is applied across the entire surface of PZT element 222. A Ni plate 225, such as electroplated or electroless plated Ni, may be deposited on the stainless steel material of base 224 and top lead 228. The leads are mechanically adhered to PZT element 222 via an adhesive layer 227 such as polyimide. Vias 251 are etched into top lead 228 and base 224, and are formed in polyimide layer 227 such as by punching or laser cutting, and then filled with a conductive material 250 such as conductive epoxy, silver solder, or other suitable conductive material.

In order to form via 251, the following procedure may be used. First, bond a B-staged (partially cured), low curing temperature (i.e., <110° C.) thermal polyimide 227 such as described in Japanese reference JP08-294993, which is hereby incorporated by reference, to a stainless steel foil that will form top lead 228. Next use a CNC drill or punch to define via 251 through polyimide 227 and top lead 228 Next, nip laminate the B-staged polyimide 227 to gold metallization layer 241 on PZT 222, and subsequently fill the via using automated dispensing equipment commonly employed in the microelectronics packaging field, such as sold under the brand name Asymtek by Asmptotic Technologies, Incorporated of Carlsbad, Calif.

Figure 5:
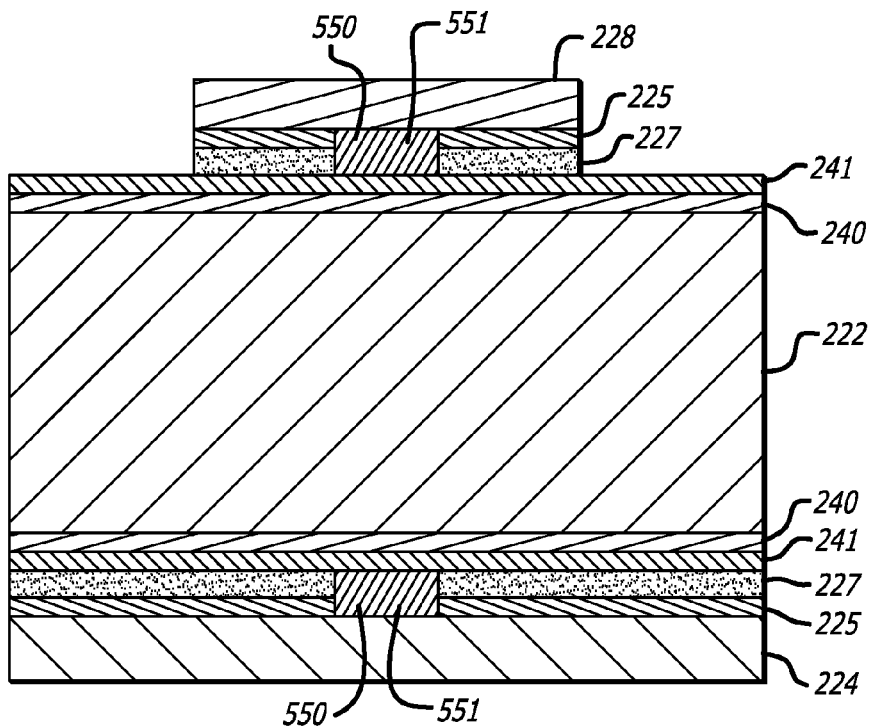
FIG. 5 is a side cutaway view of a microactuator assembly according to a fourth embodiment of the invention.

FIG. 5 is a side cutaway view of a microactuator assembly according to a fourth embodiment of the invention. In this embodiment the connection between leads 228 and 224, and PZT element 222, is different from the embodiment of FIG. 4. Specifically, vias 551 are formed only in polyimide layers 227 up to, but not through, stainless steel leads 224 and 228. As in the previous embodiment, vias 551 are filled with a conductive material 550 such as silver solder or epoxy, or other suitable conductive material. In the embodiments of both FIG. 4 and FIG. 5, the conductive material in the vias creates an electrical connection from the stainless steel leads to the highly conductive metal layer on the respective PZT element surface.

In order to form the blind via 551, the following procedure may be used. First, bond a B-staged (partially cured), low curing temperature thermal polyimide 227 to a stainless steel foil that will form top lead 228. Next, use an ultraviolet laser such as a 248 nm excimer laser in order to ablate the B-staged polyimide 227 without impacting the Ni layer 225 or the stainless steel top lead 228. Then fill via 551 with conductive material 550. Finally, nip laminate the B-staged polyimide 227 to gold metalization layer 241 on PZT 222

Figure 6:
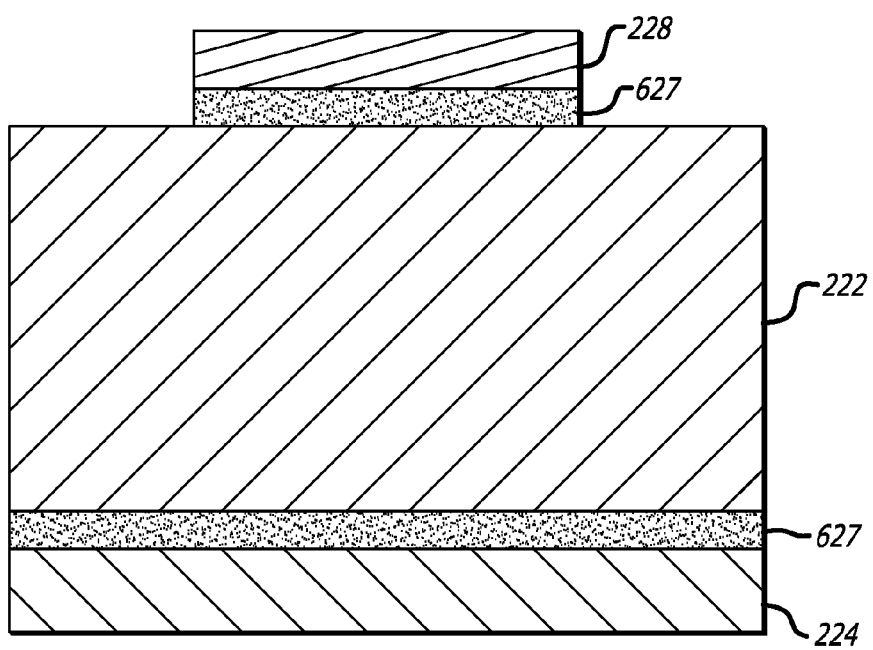
FIG. 6 is a side cutaway view of a microactuator assembly according to a fifth embodiment of the invention.

FIG. 6 is a side cutaway view of a microactuator assembly according to a fifth embodiment of the invention. In this embodiment, the stainless steel leads 228 and 224 are connected directly via conductive adhesive 627 to the top and bottom surfaces, which are the positive and negative electrodes, respectively, of PZT element 222. It will be understood that this embodiment also preferably has the Ni plating, sputtered Ni or Cr layer, and sputtered Ag or Ti layer as shown in FIG. 4, and that those layers are committed from FIG. 6 for simplicity of illustration. Conductive adhesive 627 can be an anisotropic adhesive. Anisotropic adhesive is preferred in cases in which the PZT is a segmented or split plane PZT, such as described in U.S. Pat. No. 7,459,835 issued to Mei, et al. Anisotropic adhesives are adhesives that conduct in the Z direction, but do not conduct well in the X-Y plane. The selective direction of electrical conductively is usually obtained by adding small metal spheres to the adhesive in small concentrations, with the parts then being pressed tightly against each other during curing, so that the metal spheres conduct electrical charge between the two objects being adhered together. The concentration of metal spheres is so small that there is negligible conductivity between the different spheres horizontally, and each sphere acts as a vertically conductive island in an otherwise insulating sea. Anisotropic adhesives are well known.

FIG. 7 is an exploded perspective view of a suspension including the microactuator assembly 20 of FIG. 1A. Suspension 700 includes a stainless steel substrate 701, microactuator assembly 20, and flexible circuit 740. The stainless steel substrate 701 has a non-recessed area 704, and a recessed area 702 formed therein such as by etching. Microactuator assembly 20 defines the left side microactuator assembly whose bases 24 and 26 are welded such as by laser welding to define welds located at weld locations on bases 24 and 26 such as weld locations 32 shown in FIG. 1A, to weld locations 724 and 726 within recessed area 702 in substrate 701, thereby defining mechanical and electrical connections between bases 24 and 26 and suspension substrate 701. A right side microactuator (not show) is also included in the completed suspension. Its bases are welded to recessed area 702 of suspension substrate 701 at weld locations 734 and 736. It is not necessary that the suspension have a recessed area 702 in which microactuator assemblies 20 are located. Providing a recessed area 702, however, helps the suspension to maintain a low profile, which is important in helping to keep a low profile for a multiple disk stack within a multiple platter disk drive.

Figure 8A:
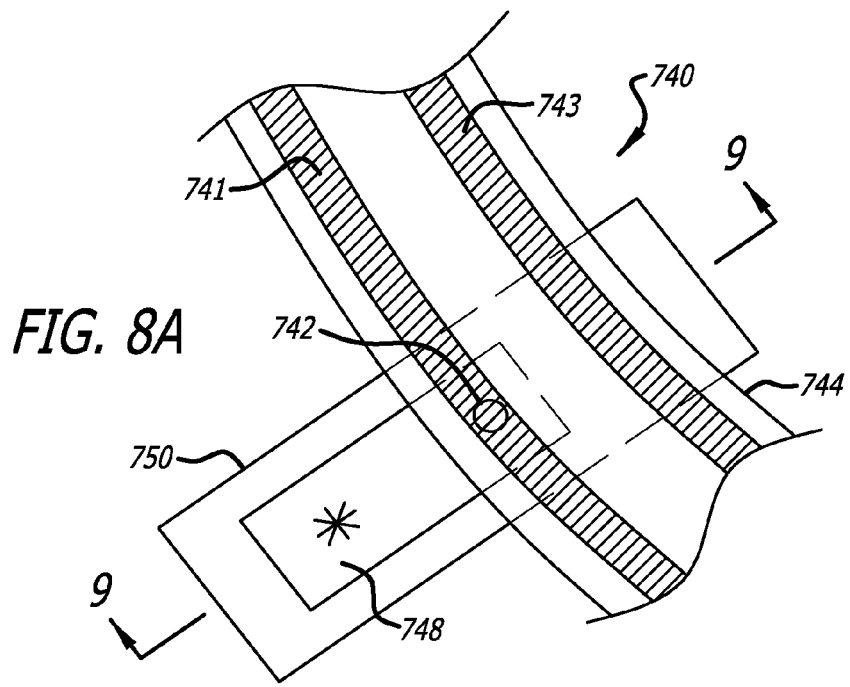
FIG. 8A is a top plan view of a section of the flexible circuit 740 of FIG. 7.
Figure 8B:
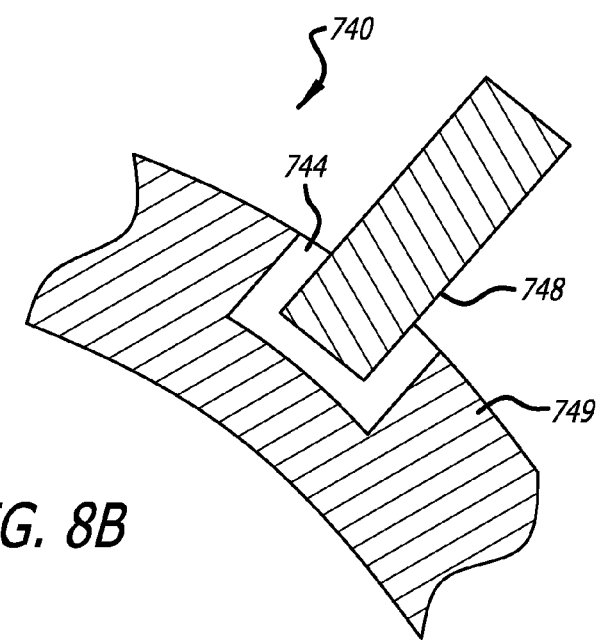
FIG. 8B is a bottom plane view of the flexible circuit 740 of FIG. 8.
Figure 9:
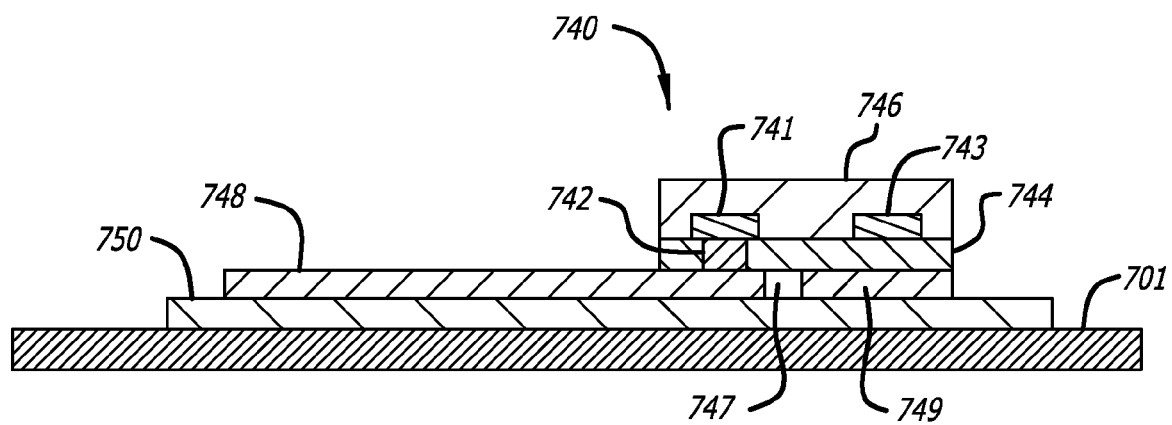
FIG. 9 is a side cutaway view of the flex trace of FIG. 8 taken along section line 9-9.

FIG. 8A is a top plan view of a section of the flexible circuit 740 of FIG. 7; FIG. 8B is a bottom plan view; and FIG. 9 is a cutaway view of flexible circuit 740 taken along section line 9-9. Flexible circuits for suspensions are generally well known and generally include a polyimide substrate 744 on a thin stainless steel substrate 749, with copper conductors such as conductors 741 and 743 thereon for carrying signals to and from the read/write head and for carrying the PZT activation voltages in a microactuated suspension, and an insulating top coat (not shown) on top. In this embodiment, however, flexible circuit 740 also includes a via 742 through polyimide 744 filled with conductive material for transmitting the PZT activation voltage from copper conductor 741 which carries the PZT activation voltage to a bond pad 748 which extends at least partially underneath flexible circuit 740. In the exemplary embodiment bond pad 748 is stainless steel sheet material, and is electrically isolated from suspension substrate 701 by an insulating layer 750 such as KAPTON® tape film placed on suspension substrate 701. Bond pad 748 is formed of the same thin stainless steel sheet to which the polyimide layer 744 is bonded, but is electrically isolated from the rest of that stainless steel sheet that underlays flexible circuit 740 by an isolation trench 747 etched into the stainless steel material. Thus, stainless steel bond pad 748 is isolated from the rest of stainless steel sheet 749 underlying the flexible circuit, which is generally allowed to contact the stainless steel substrate 701 of suspension 700 in other areas. Lead tab 30 of top lead 28 is laser welded to bond pad 748 to define a weld located at a weld location on lead 28 such as weld locations 34 shown in FIG. 1A, thus completing the electrical connection from PZT actuation voltage carrying signal trace 741 in flexible circuit 740 to the positive electrode of PZT element 22 and defining a mechanical and electrical connection between lead 28 and a conductor carrying a microactuator driving voltage.

It will be appreciated that the term "present invention" as used herein should not be construed to mean that only a single invention having a single essential element or group of elements is presented. Similarly, it will also be appreciated that the term "present invention" encompasses a number of separate innovations which can each be considered separate inventions.

Although the present invention has thus been described in detail with regard to the preferred embodiments and drawings thereof, it should be apparent to those skilled in the art that various adaptations and modifications of the present invention may be accomplished without departing from the spirit and the scope of the invention. For example, the PZT assembly(ies) need not be located at the position on the suspension exemplary embodiment shown in FIG. 7, which is on the load beam distal of the spring region. Instead, the PZT assembly (ies) could be located under the head slider, on the load beam as shown in the figure, or on the load beam proximal of the spring region. Similarly, the PZT element(s) need not have the same metallizations shown in the exemplary embodiment; the metals used for the suspension substrate and the leads need not necessarily be stainless steel; and the leads on the PZT elements need not be located at the positions shown in the exemplary embodiments. The suspension can have one microactuator on it, or can have the more conventional two microactuators on it. Any suitable mechanical and electrical connections to the PZT elements can be used. The suspension may have a recess in it for receiving the PZT assemblies, or not. Piezoelectric elements other than lead zirconate titanate may be used. The invention could also be applied to various types of microactuators other than piezoelectric elements, including possibly microactuator types that have not yet been invented. The invention could also be used in other types of drives other than magnetic disk drives, such as optical disk drives, for example. Still further, the invention of a PZT assembly with all weldable leads could also be used in a variety of applications other than disk drive suspensions.

Accordingly, it is to be understood that the detailed description and the accompanying drawings as set forth hereinabove are not intended to limit the breadth of the present invention, which should be inferred only from the following claims and their appropriately construed legal equivalents.

I claim:

1. A microactuated suspension comprising:
    a stainless steel substrate;
    a load beam formed from the substrate;
    a microactuator unit mounted to the suspension, the microactuator unit comprising:
        a piezoelectric element having a positive electrode at a first surface thereof and a negative electrode at a second surface thereof;
        a first stainless steel lead affixed to the piezoelectric element first surface and in electrical communication with the positive electrode without a wire therebetween, said first stainless steel lead having a weld location thereon;
        second and third stainless steel leads affixed to the piezoelectric element second surface and in electrical communication with the negative electrode without a wire therebetween, said second and third stainless steel leads having respective weld locations thereon;
        a first weld at said first stainless steel lead weld location, the first weld defining a mechanical and electrical connection to a conductor carrying a microactuator driving voltage; and
        second and third welds at said second and third stainless steel lead weld locations, respectively, the second and third welds defining respective mechanical and electrical connections to the suspension substrate; and wherein
    the second and third stainless steel leads extend beyond a periphery of the piezoelectric element, the second and third stainless steal lead weld locations being located at respective positions that are beyond said piezoelectric element periphery; and
    the first stainless steel lead extends beyond the piezoelectric element periphery, the first stainless steel lead weld location being located at a position that is beyond said piezoelectric element periphery.

2. The microactuated suspension of claim 1 wherein the first, second, and third stainless steel leads are directly electrically connected to the piezoelectric element by conductive adhesive.

3. The microactuated suspension of claim 1 wherein the first, second, and third stainless steel leads are connected to the piezoelectric element through vias extending through respective insulating layers, the vias being filled with conductive material.

4. The microactuated suspension of claim 1 further comprising a flexible circuit, and wherein the conductor carrying the microactuator driving voltage comprises stainless steel sheet material, the stainless steel sheet material being electrically isolated from the suspension substrate and being electrically connected to a conductor within the flexible circuit.

5. The suspension of claim 1 wherein the second and third stainless steel leads comprise two separate elements affixed at opposite ends of the piezoelectric element.

6. The suspension of claim 1 wherein the second and third stainless steel leads are welded to the substrate.

7. The suspension of claim 1 wherein:
    the second and third stainless steel leads comprise two metallic bases affixed at opposite ends of the piezoelectric element and affixed thereto by electrically conductive adhesive; and
    the two metallic bases are welded to the stainless steel substrate.

8. The suspension of claim 1 wherein the second and third stainless steel leads are connected together by an expandable bridge, the second and third stainless steel leads and the expandable bridge together defining a unitary base comprising a single continuous piece of material.

9. The suspension of claim 8 wherein the expandable bridge has expanding features comprising at least one of folds, corrugations, and voids arranged in a serpentine pattern.

10. A microactuated suspension comprising:
    a stainless steel substrate;
    a load beam formed from the substrate;
    a microactuator unit mounted to the suspension, the microactuator unit comprising:
        a piezoelectric element having a positive electrode at a first surface thereof and a negative electrode at a second surface thereof;
        a first stainless steel lead affixed to the piezoelectric element first surface and in electrical communication with the positive electrode without a wire therebetween, said first stainless steel lead having a weld location thereon;
        second and third stainless steel leads affixed to the piezoelectric element second surface and in electrical communication with the negative electrode without a wire therebetween, said second and third stainless steel leads having respective weld locations thereon;

a first weld at said first stainless steel lead weld location, the first weld defining a mechanical and electrical connection to a conductor carrying a microactuator driving voltage; and second and third welds at said second and third stainless steel lead weld locations, respectively, the second and third welds defining respective mechanical and electrical connections to the suspension substrate; and wherein the second and third stainless steel leads extend beyond a periphery of the piezoelectric element, the second and third stainless steal lead weld locations being located at respective positions that are beyond said piezoelectric element periphery;

the first stainless steel lead extends beyond the piezoelectric element periphery, the first stainless steel lead weld location being located at a position that is beyond said piezoelectric element periphery; and the first stainless steel lead carries an actuation voltage that drives the piezoelectric element.

11. The suspension of claim 10 wherein the second and third stainless steel leads are connected together by an expandable bridge, the second and third stainless steel leads and the expandable bridge together defining a unitary base comprising a single continuous piece of material.

12. The suspension of claim 11 wherein the expandable bridge has expanding features comprising at least one of folds, corrugations, and voids arranged in a serpentine pattern.

13. The suspension of claim 10 wherein the first stainless steel lead is welded to a sheet material that carries a microactuator actuation voltage.

14. The suspension of claim 10 wherein at least one of the stainless steel leads is electrically connected to the piezoelectric element through a via extending through an insulative material attached to the piezoelectric element, the via filled with a conductive material.

15. The suspension of claim 14 wherein the conductive material is selected from the group consisting of silver solder and conductive epoxy.

16. The suspension of claim 10 wherein:

the suspension further includes a mount plate, a load beam attached to a base plate through a spring region, and a slider proximate a distal end of the load beam; and the microactuator unit is arranged to effect fine movements of the slider.

17. The suspension of claim 10 wherein the first stainless steel lead is welded to a generally planar bond pad, the bond pad carrying the actuation voltage.

18. The suspension of claim 17 wherein:

the at least one of the second and third stainless steel leads is mounted to a recessed surface of the suspension substrate; and the bond pad is mounted to a non-recessed surface of the suspension substrate and electrically separated therefrom by an insulating layer.

* * * * *